United States Patent
Jang et al.

(10) Patent No.: US 12,332,778 B2
(45) Date of Patent: *Jun. 17, 2025

(54) MEMORY SYSTEM, MEMORY CONTROLLER, AND METHOD FOR OPERATING SAME

(71) Applicant: SK hynix Inc., Gyeonggi-do (KR)

(72) Inventors: Min Jun Jang, Gyeonggi-do (KR); Hyoung Pil Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/176,935

(22) Filed: Mar. 1, 2023

(65) Prior Publication Data

US 2023/0205688 A1 Jun. 29, 2023

Related U.S. Application Data

(63) Continuation of application No. 16/891,314, filed on Jun. 3, 2020, now Pat. No. 11,630,764.

(30) Foreign Application Priority Data

Nov. 27, 2019 (KR) .......................... 10-2019-0153987

(51) Int. Cl.
*G06F 12/02* (2006.01)
*G06F 11/30* (2006.01)
(Continued)

(52) U.S. Cl.
CPC ...... *G06F 12/0246* (2013.01); *G06F 12/0253* (2013.01); *G06F 11/3037* (2013.01);
(Continued)

(58) Field of Classification Search
CPC ............. G06F 12/0246; G06F 12/0253; G06F 12/0261; G06F 12/0269; G06F 12/0276;
(Continued)

(56) References Cited

U.S. PATENT DOCUMENTS 8,364,918 B1 * 1/2013 Smith ................. G06F 11/3419
711/159
8,725,931 B1 * 5/2014 Kang .................. G06F 12/0246
710/52
(Continued)

FOREIGN PATENT DOCUMENTS

KR 10-2008-0007462 A 1/2008
KR 10-2016-0120381 A 10/2016

OTHER PUBLICATIONS

NPL Qin Real Time FTL for NAND Flash Memory 2012.*
(Continued)

*Primary Examiner* — Paul M Knight
(74) *Attorney, Agent, or Firm* — IP & T GROUP LLP

(57) ABSTRACT

Embodiments of the present disclosure relate to a memory system, a memory controller, and a method for operating the same. Garbage collection is performed with regard to the memory device on the basis of a first amount of time and a second amount of time, the first amount of time being a period of time between triggering of first garbage collection and triggering of second garbage collection, and the second amount of time being an amount of time necessary to perform the second garbage collection. A ratio of the first amount of time to the second amount of time is determined as a target ratio value, and the second amount of time is determined to be equal to or longer than a minimum garbage collection operation time. Accordingly, efficient garbage collection can be performed, and the optimal time to perform garbage collection can be determined with regard to a configured performance drop value.

16 Claims, 13 Drawing Sheets

(51) Int. Cl.
*G06F 12/06* (2006.01)
*G06F 13/16* (2006.01)

(52) U.S. Cl.
CPC ...... *G06F 12/0646* (2013.01); *G06F 13/1689* (2013.01); *G06F 2212/1016* (2013.01); *G06F 2212/7205* (2013.01)

(58) Field of Classification Search
CPC ........... G06F 12/0284; G06F 2212/702; G06F 2212/7205; G06F 2210/7205
See application file for complete search history.

(56) References Cited

U.S. PATENT DOCUMENTS

| | | | | |
|---|---|---|---|---|
| 8,949,555 | B1* | 2/2015 | Karamcheti | G06F 13/1657 711/158 |
| 2008/0034174 | A1* | 2/2008 | Traister | G06F 12/0246 711/159 |
| 2008/0034175 | A1* | 2/2008 | Traister | G06F 12/0246 711/159 |
| 2011/0055455 | A1* | 3/2011 | Post | G06F 12/0246 711/E12.001 |
| 2012/0278530 | A1* | 11/2012 | Ebsen | G06F 13/1684 711/E12.008 |
| 2013/0290611 | A1* | 10/2013 | Biederman | G06F 3/0689 711/114 |
| 2016/0062885 | A1* | 3/2016 | Ryu | G06F 12/0253 711/103 |
| 2017/0115932 | A1* | 4/2017 | Mitsumasu | G06F 12/0246 |
| 2017/0300410 | A1* | 10/2017 | Zhang | G06F 12/0246 |
| 2018/0189175 | A1* | 7/2018 | Ji | G06F 3/0679 |
| 2019/0196966 | A1* | 6/2019 | Hwang | G06F 12/0246 |
| 2019/0340120 | A1* | 11/2019 | Gokita | G06F 12/0802 |
| 2020/0401515 | A1* | 12/2020 | Liang | G06F 12/0253 |
| 2021/0132815 | A1* | 5/2021 | Jang | G06F 3/0608 |

OTHER PUBLICATIONS

NPL Tavakkol FLIN Enabling Fairness and Enhancing Performance in NVMe 2018.*

NPL Choi Parallelizing GC with IO to Imrove Flash Resource Util 2018.*

NPL Jeong A Technique to Improve GC Performance for NAND 2012.*

NPL Yan Tiny Tail Flash Near Perfect Elimination of GC Tail Latencies 2017.*

Li-Pin Chang et al., Real-Time Garbage Collection for Flash-Memory Storage Systems of Real-Time Embedded Systems, ACM Transactions on Embedded Computing Systems, vol. V, No. N, Jun. 2004, pp. 1-26.

Emmanuel Goossaert, Coding for SSDs—Part 3: Pages, Blocks, and the Flash Translation Layer, Feb. 12, 2014, retrieved from https://codecapsule.com/2014/02/12/coding-for-ssds-part-1-introduction-and-table-of-contents/.

Office Action for U.S. Appl. No. 16/891,314 issued by USPTO on Aug. 19, 2021.

Office Action for U.S. Appl. No. 16/891,314 issued by USPTO on Mar. 10, 2022.

Office Action for U.S. Appl. No. 16/891,314 issued by USPTO on Aug. 15, 2022.

* cited by examiner

FIG.6

TIME_1 : TIME_2 = 5 : 1 min. value of GC operation time = 10ms

| TIME_1 (ms) | TIME_2 (ms) |
|---|---|
| 25 | 5 |
| 50 | 10 |
| 75 | 15 |
| 100 | 20 |
| 125 | 25 |
| ... | ... |

← set TIME_1 = 50 (ms), TIME_2 = 10 (ms)

MEMORY SYSTEM, MEMORY CONTROLLER, AND METHOD FOR OPERATING SAME

CROSS REFERENCE TO RELATED APPLICATION

This application is a continuation application of U.S. patent application Ser. No. 16/891,314 filed on Jun. 3, 2020, which claims priority from Korean Patent Application No. 10-2019-0153987, filed on Nov. 27, 2019, which is hereby incorporated by reference for all purposes as if fully set forth herein.

BACKGROUND OF THE INVENTION

1. Field of the Invention

Embodiments of the present disclosure relate to a memory system, a memory controller, and a method for operating the same.

2. Description of the Prior Art

A memory system, e.g., a storage device, stores data on the basis of a request of a host such as a computer, a mobile terminal (for example, a smartphone or a tablet), or other kinds of electronic devices. The memory system may include not only a device configured to store data in a magnetic disk, such as a hard disk drive (HDD), but also a device configured to store data in a nonvolatile memory, such as a solid state drive (SSD), a universal flash storage (UFS) device, and an embedded MMC (eMMC) device.

The memory system may further include a memory controller for controlling the memory device (for example, volatile memory/nonvolatile memory). The memory controller may receive a command input from the host and may perform or control operations for reading, writing, or erasing data in the memory device included in the memory system on the basis of the received command. In addition, the memory controller may drive firmware for performing a logical operation for performing or controlling such operations.

The memory controller may perform garbage collection with regard to the memory device, in order to secure additional free memory blocks, if the number of free memory blocks in the memory device becomes insufficient in the course of repeatedly writing data in the memory device.

SUMMARY OF THE INVENTION

Embodiments of the present disclosure may provide a memory system, a memory controller, and a method for operating the same, wherein garbage collection can be performed efficiently.

In addition, embodiments of the present disclosure may provide a memory system, a memory controller, and a method for operating the same, wherein the optimal time to perform garbage collection can be determined with regard to a configured performance drop value.

In an aspect, embodiments of the present disclosure may provide a memory system including a memory device and a memory controller configured to control the memory device.

The memory controller may perform garbage collection with regard to the memory device on the basis of a first amount of time and a second amount of time, the first amount of time being a period of time between triggering of first garbage collection and triggering of second garbage collection, and the second amount of time being an amount of time necessary to perform the second garbage collection.

The memory controller may determine a ratio of the second amount of time against the first amount of time as a target ratio value, and may determine the second amount of time to be equal to or longer than a minimum garbage collection operation time.

The memory controller may determine the first amount of time on the basis of a time at which the total sum of the size of user data written in the memory device, since triggering of the first garbage collection, becomes equal to or greater than a threshold.

The memory controller may determine the second amount of time on the basis of a performance drop value.

For example, the memory controller may determine a first data size, which is a size of data written in the memory device when the second garbage collection is performed. The memory controller may determine the first data size on the basis of the performance drop value and ii) a second data size, which is the total sum of the size of user data written in the memory device since the first garbage collection is triggered.

The memory controller may determine the second amount of time on the basis of a value obtained by dividing the first data size by a number of partial programs that can be programmed in the memory device per a set amount of time.

As another example, the memory controller may determine the second amount of time on the basis of i) a performance drop value and ii) a read time, which is an amount of time spent to perform a user data reading operation since the first garbage collection is triggered.

In another aspect, embodiments of the present disclosure may provide a memory controller including: a memory interface configured to communicate with a memory device; and a control circuit configured to control the memory device.

The control circuit may perform garbage collection with regard to the memory device on the basis of a first amount of time and a second amount of time, the first amount of time being a period of time between triggering of first garbage collection and triggering of second garbage collection, and the second amount of time being an amount of time necessary to perform the second garbage collection.

The control circuit may determine a ratio of the second amount of time against the first amount of time as a target ratio value, and may determine the second amount of time to be equal to or longer than a minimum garbage collection operation time.

The control circuit may determine the first amount of time on the basis of a time at which the total sum of the size of user data written in the memory device, since triggering of the first garbage collection, becomes equal to or greater than a threshold.

The control circuit may determine the second amount of time on the basis of a performance drop value.

For example, the control circuit may determine a first data it size, which is a size of data written in the memory device when the second garbage collection is performed. The control circuit may determine the first data size on the basis of i) the performance drop value and ii) a second data size, which is the total sum of the size of user data written in the memory device since the first garbage collection is triggered.

As another example, the control circuit may determine the second amount of time on the basis of i) a performance drop value and ii) a read time, which is an amount of time spent to perform a user data reading operation since the first garbage collection is triggered.

In another aspect, embodiments of the present disclosure may provide a method for operating a memory controller.

A method for operating a memory controller may include a step of determining a first amount of time, which is a period of time between triggering of first garbage collection and triggering of second garbage collection.

The method for operating a memory controller may include a step of determining a second amount of time, which is an amount of time necessary to perform the second garbage collection.

The method for operating a memory controller may include a step of performing garbage collection with regard to the memory device on the basis of the first amount of time and the second amount of time. A ratio of the second amount of time against the first amount of time may be determined as a target ratio value, and the second amount of time may be determined to be equal to or longer than a minimum garbage collection operation time.

In another aspect, embodiments of the present disclosure may provide an operating method of a controller.

The operating method of a controller may include a step of determining a minimum operation time for a subsequent of two time-adjacent garbage collection operations based on an amount of data to be processed, a performance drop value and a number of partial programs performed in a set amount of time.

The operating method of a controller may include a step of controlling a memory device to perform the garbage collection operations according to a target ratio based on the minimum operation time.

The period between two time-adjacent garbage collection operations enables the controller to control the memory device to process the amount of data in response to requests from a host.

According to embodiments of the present disclosure, garbage collection can be performed efficiently.

In addition, according to embodiments of the present disclosure, the optimal time to perform garbage collection can be determined with regard to a configured performance drop value.

BRIEF DESCRIPTION OF THE DRAWINGS

The above and other aspects, features and advantages of the present disclosure will be more apparent from the following detailed description taken in conjunction with the accompanying drawings, in which:

FIG. 6 is a diagram illustrating a criterion used by a memory system according to an embodiment of the present disclosure to determine a first amount of time and a second amount of time;

DETAILED DESCRIPTION

Hereinafter, embodiments of the present disclosure are described in detail with reference to the accompanying drawings, Throughout the specification, reference to "an embodiment," "another embodiment" or the like is not necessarily to only one embodiment, and different references to any such phrase are not necessarily to the same embodiment(s).

Figure 1:
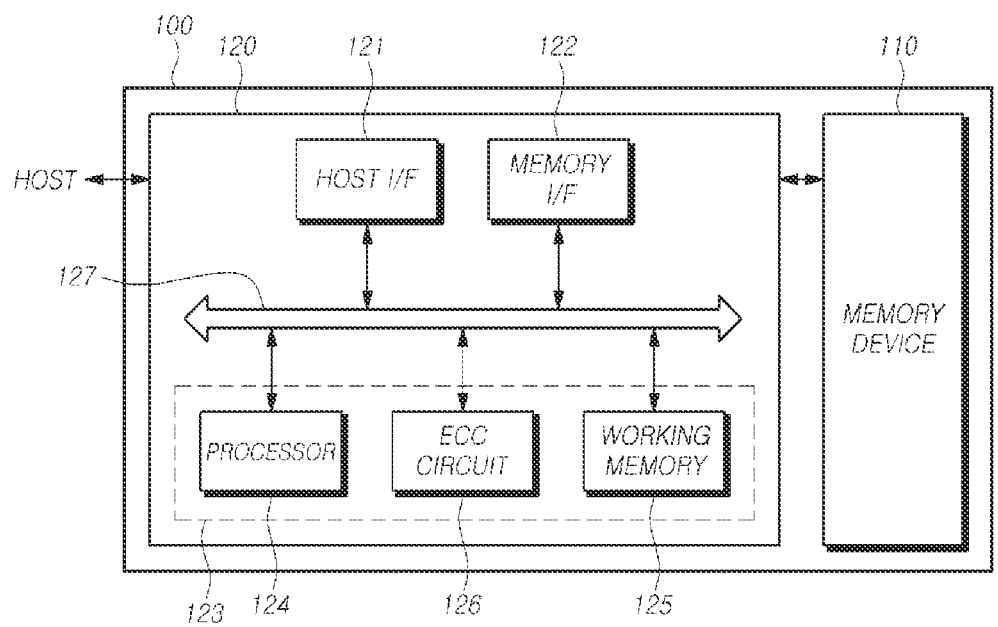
FIG. 1 is a schematic diagram illustrating a configuration of a memory system according to an embodiment of the present disclosure.

FIG. 1 is a diagram illustrating a schematic configuration of a memory system 100 according to an embodiment of the present disclosure.

Referring to FIG. 1, the memory system 100 may include a memory device 110 configured to store data, a memory controller 120 configured to control the memory device 110, and the like.

The memory device 110 includes multiple memory blocks and operates in response to control of the memory device 120. Operations of the memory device 110 may include, for example, a read operation, a program operation (also referred to as "write operation"), an erasure operation, and the like.

The memory device 110 may include a memory cell array including multiple memory cells (also simply referred to as "cell") configured to store data. The memory cell array may exist in a memory block.

The memory device 110 may be implemented as any of various types of memories, such as a double data rate synchronous dynamic random access memory (DDR SDRAM), a low power double data rate4 (LPDDR4) SDRAM, a graphics double data rate (DDDR) SDRAM, a low power DDR (LPDDR), a Rambus dynamic random access memory (RDRAM), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Embodiments of the present disclosure are applicable not only to a flash memory device having a charge storage layer configured by a conductive floating gate, but also to a charge trap flash (CTF) having a charge storage layer configured by an insulating film.

The memory device 110 is configured to receive a command, an address, and the like from the memory controller 120 and to access an area selected by the address inside the memory cell array. That is, the memory device 110 may perform an operation corresponding to the command with regard to the area selected by the address.

For example, the memory device 110 may perform a program operation, a read operation, an erasure operation, and the like. In relation thereto, during a program operation, the memory device 110 may program data in an area selected by an address. During a read operation, the memory device 110 may read data from an area selected by an address. During an erasure operation, the memory device 110 may erase data stored in an area selected by an address.

The memory controller 120 may control a write (program) operation, a read operation, an erasure operation, and a background operation regarding the memory device 110. The background operation may include a garbage collection (GC) operation, a wear leveling (WL) operation, and/or a bad block management (BBM) operation.

The memory controller 120 may control operations of the memory device 110 at the request of a host (HOST). Alternatively, the memory controller 120 may control operations of the memory device 110 regardless of the request of the host.

The memory controller 120 and the host may be separate devices. In another embodiment, the memory controller 120 and the host may be integrated into and implemented as a single device. By way of example, features and aspects of the present invention are described below in the context in which the memory controller 120 and the host are separate devices.

Referring to FIG. 1, the memory controller 120 may include a memory interface 122, a control circuit 123, and a host interface 121.

The host interface 121 is configured to provide an interface for communicating with the host.

When receiving a command from the host, the control circuit 123 may perform operations of receiving the command through the host interface 121 and processing the received command.

The memory interface 122 is connected to the memory device 110 and is configured to provide an interface for communicating with the memory device 110. That is, the memory interface 122 may be configured to provide an interface between the memory device 110 and the memory controller 120 in response to control of the control circuit 123.

The control circuit 123 is configured to control overall operation of the memory controller 120, thereby controlling operations of the memory device 110. To this end, the control circuit 123 may include, for example, a processor 124 and/or a working memory 124, and may further include an error detection-and-correction circuit (ECC circuit) 126, if necessary.

The processor 124 may control overall operation of the memory controller 120 and may perform logical operations. The processor 124 may communicate with the host through the host interface 121 and may communicate with the memory device 110 through the memory interface 122.

The processor 124 may perform the function of a flash translation layer (FTL). The processor 124 may convert a logical block address (LBA) provided by the host to a physical block address (PBA) through the FTL. The FTL may receive the LBA and convert the same to the PBA by using a mapping table.

The FTL may map addresses in various methods, depending on the mapping unit. Typical address mapping methods include a page mapping method, a block mapping method, and a hybrid mapping method.

The processor 124 is configured to randomize data received from the host. For example, the processor 124 may randomize data received from the host by using a randomizing seed. The randomized data is provided to the memory device 110 as data to be stored, and is programmed in the memory cell array.

The processor 124 is configured to derandomize data received from the memory device 110 during a read operation. For example, the processor 124 may derandomize data received from the memory device 110 by using a derandomizing seed. The derandomized data may be output to the host.

The processor 124 may execute firmware so as to control operations of the memory controller 120. In other words, the processor 124 may control overall operation of the memory controller 120 and may execute (drive) firmware loaded into the working memory 125 during booting, in order to perform a logical operation.

The firmware may be a program executed inside the memory system 100, and may include various functional layers.

For example, the firmware may include at least one selected from a flash translation layer (FTL) configured to translate between a logical address that the host HOS requests the memory system 100 to provide and a physical address of the memory device 110, a host interface layer (HIL) configured to interpret a command that the host requests the memory system 100 (storage device) to follow and to deliver the same to the FTL, and a flash interface layer (FIL) configured to deliver a command issued by the FTL to the memory device 110.

The firmware may be stored in the memory device 110, for example, and then loaded into the working memory 125.

The working memory 125 may store firmware, program codes, commands, or data necessary to drive the memory controller 120. The working memory 125 may include, as a volatile memory, a static RAM (SRAM), a dynamic RAM (DRAM), and/or a synchronous DRAM (SDRAM), for example.

The error detection-and-correction circuit 126 may be configured to detect an error bit of checking target data by using an error correction code and to correct the detected error bit. The checking target data may be, for example, data stored in the working memory 125 or data retrieved from the memory device 110.

The error detection-and-correction circuit 126 may be implemented to decode data by using the error correction code. The error detection-and-correction circuit 126 may be implemented by various code decoders. For example, a decoder configured to perform unsystematic code decoding or a decoder configured to perform systematic code decoding may be used.

For example, the error detection-and-correction circuit 126 may detect error bits, sector by sector, with regard to respective pieces of read data. That is, each piece of read data may include multiple sectors. A sector may refer to a data unit smaller than a page, which is the read unit of a flash memory. Sectors constituting each piece of read data may correspond to each other via addresses.

The error detection-and-correction circuit 126 may calculate a bit error rate (BER) and determine whether or not each sector is correctable. For example, if the BER is higher than a reference value, the error detection-and-correction circuit 126 may determine that the corresponding sector is uncorrectable (or has failed). On the other hand, if the BER is lower than the reference value, the error detection-and-correction circuit 126 may determine that the corresponding sector is correctable (or has passed).

The error detection-and-correction circuit 126 may successively perform error detection and correction operations with regard to all pieces of read data. If a sector included in read data is correctable, the error detection-and-correction circuit 126 may omit the error detection and correction operations regarding the corresponding sector with regard to the next piece of read data. After the error detection correction operations are finished with regard to all pieces of read data in this manner, the error detection-and-correction circuit 126 may detect a sector deemed uncorrectable to the end. There may be one or more sectors deemed uncorrectable. The error detection-and-correction circuit 126 may deliver information (for example, address information) regarding the sector deemed uncorrectable to the processor 124.

The bus 127 may be configured to provide a channel between the components 121, 122, 124, 125, and 126 of the memory controller 120, The bus 127 may include, for example, a control bus for delivering various kinds of control signals and commands and a data bus for delivering various kinds of data.

The memory controller 120 and the above-mentioned components 121, 122, 124, 125, and 126 represents an example configuration. In other configurations, one or more of these components may be omitted, and/or one or more components may be integrated into a single component. Of course, the memory controller 120 may include one or more additional components.

Hereinafter, the memory device 110 is described in more detail with reference to FIG. 2.

Figure 2:
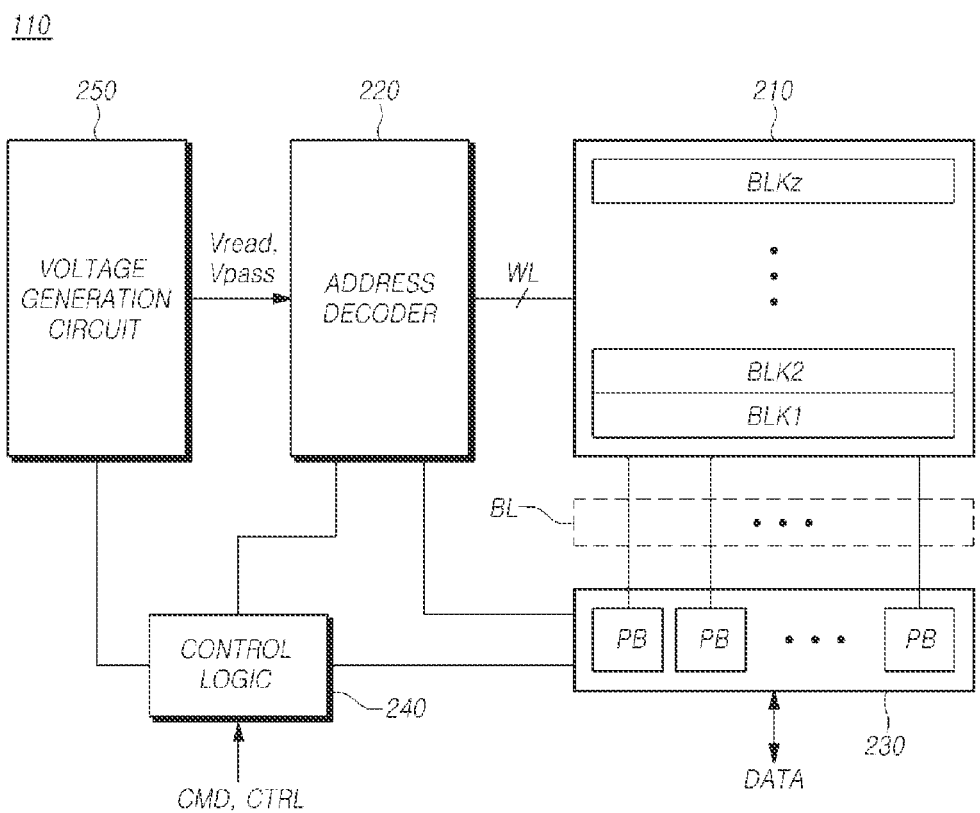
FIG. 2 is a block diagram schematically illustrating a memory device according to an embodiment of the present disclosure.

FIG. 2 is a block diagram schematically illustrating a memory device 110 according to an embodiment of the present disclosure.

Referring to FIG. 2, the memory device 110 may include a memory cell array 210, an address decoder 220, a read-and-write circuit 230, control logic 240, a voltage generation circuit 250, and the like.

The memory cell array 210 may include multiple memory blocks BLK1-BLKz (z is a natural number equal to or larger than 2).

In the multiple memory blocks BLK1-BLKz, multiple word lines WL and multiple bit lines BL may be disposed, and multiple memory cells MC may be arranged therein.

The multiple memory blocks BLK1-BLKz may be connected to the address decoder 220 through the multiple word lines WL. The multiple memory blocks BLK1-BLKz may be connected to the read-and-write circuit 230 through the multiple bit lines BL.

Each of the multiple memory blocks BLK1-BLKz may include multiple memory cells. For example, the multiple memory cells may be nonvolatile memory cells, and may include nonvolatile memory cells having a vertical channel structure.

The memory cell array 210 may be configured as a two-dimensional structure, or a three-dimensional structure.

Each of the multiple memory cells included in the memory cell array 210 may store at least one bit of data. For example, each of the multiple memory cells included in the memory cell array 210 may be a single-level cell (SLC) configured to store one bit of data, a multi-level cell (MLC) configured to store two bits of data, a triple-level cell (TLC) configured to store three bits of data, or a quad-level cell (QLC) configured to store four bits of data. As another example, the memory cell array 210 may include multiple memory cells each configured to store at least five bits of data.

Referring to FIG. 2, the address decoder 220, the read-and-write circuit 230, the control logic 240, the voltage generation circuit 250, and the like may operate as peripheral circuits configured to drive the memory cell array 210.

The address decoder 220 may be connected to the memory cell array 210 through multiple word lines WL.

The address decoder 220 may be configured to operate in response to control of the control logic 240.

The address decoder 220 may receive addresses through an input/output buffer inside the memory device 110. The address decoder 220 may be configured to decode a block address among the received addresses. The address decoder 220 may select at least one memory block according to the decoded block address.

The address decoder 220 may receive a read voltage Vread and a pass voltage Vpass from the voltage generation circuit 250.

In the case of a read voltage applying operation during a read operation, the address decoder 220 may apply a read voltage Vread to a selected word line WL inside a selected memory block, and may apply a pass voltage Vpass to the remaining unselected word lines WL.

During a program verification operation, the address decoder 220 may apply a verification voltage generated by the voltage generation circuit 250 to the selected word line WL inside the selected memory block, and may apply a pass voltage Vpass to the remaining unselected word lines WL.

The address decoder 220 may be configured to decode a column address among received addresses. The address decoder 220 may transmit the decoded column address to the read-and-write circuit 230.

The read operation and program operation of the memory device 110 may be performed page by page. Addresses received when the read operation and program operation are requested may include a block address, a row address, and/or a column address.

The address decoder 220 may select one memory block and one word line according to the block address and the row address. The column address may be decoded by the address decoder 220 and provided to the read-and-write circuit 230.

The address decoder 220 may include a block decoder, a row decoder, a column decoder, and/or an address buffer.

The read-and-write circuit 230 may include multiple page buffers PB. The read-and-write circuit 230 may operate as a "read circuit" during a read operation of the memory cell array 210 and may operate as a "write circuit" during a write operation thereof.

The above-mentioned read-and-write circuit 230 is also referred to as a page buffer circuit including multiple page buffers PB, or a data register circuit. The read-and-write circuit 230 may include a data buffer in charge of a data processing function, and may further include a cache buffer in charge of a caching function, if necessary.

The multiple page buffers PB may be connected to the memory cell array 210 through multiple bit lines BL. During a read operation and a program verification operation, the multiple page buffers PB may continuously supply a sensing current to bit lines BL connected to memory cells, in order to sense the threshold voltage Vth of the memory cells, may sense a change in the amount of flowing current according to the program state of a corresponding memory cell through a sensing node, and may latch the same as sensing data.

The read-and-write circuit 230 may operate in response to page buffer control signals output from the control logic 240.

During a read operation, the read-and-write circuit 230 senses data in a memory cell, temporarily stores the retrieved data, and outputs the data (DATA) to the input/output buffer of the memory device 110. In an embodiment, the read-and-write circuit 230 may include a column selection circuit and the like in addition to the page buffers PB or page resisters.

The control logic 240 may be connected to the address decoder 220, the read-and-write circuit 230, the voltage generation circuit 250, and the like. The control logic 240 may receive a command CMD and a control signal CTRL through the input/output buffer of the memory device 110.

The control logic 240 may be configured to control overall operation of the memory device 110 in response to the control signal CTRL. The control logic 240 may output a control signal for adjusting the pre-charge potential level of sensing nodes of multiple page buffers PB.

The control logic 240 may control the read-and-write circuit 230 so as to perform a read operation of the memory cell array 210. In response to a voltage generation circuit control signal output from the control logic 240, the voltage generation circuit 250 may generate a read voltage Vread and a pass voltage Vpass, which are used during a read operation.

Figure 3:
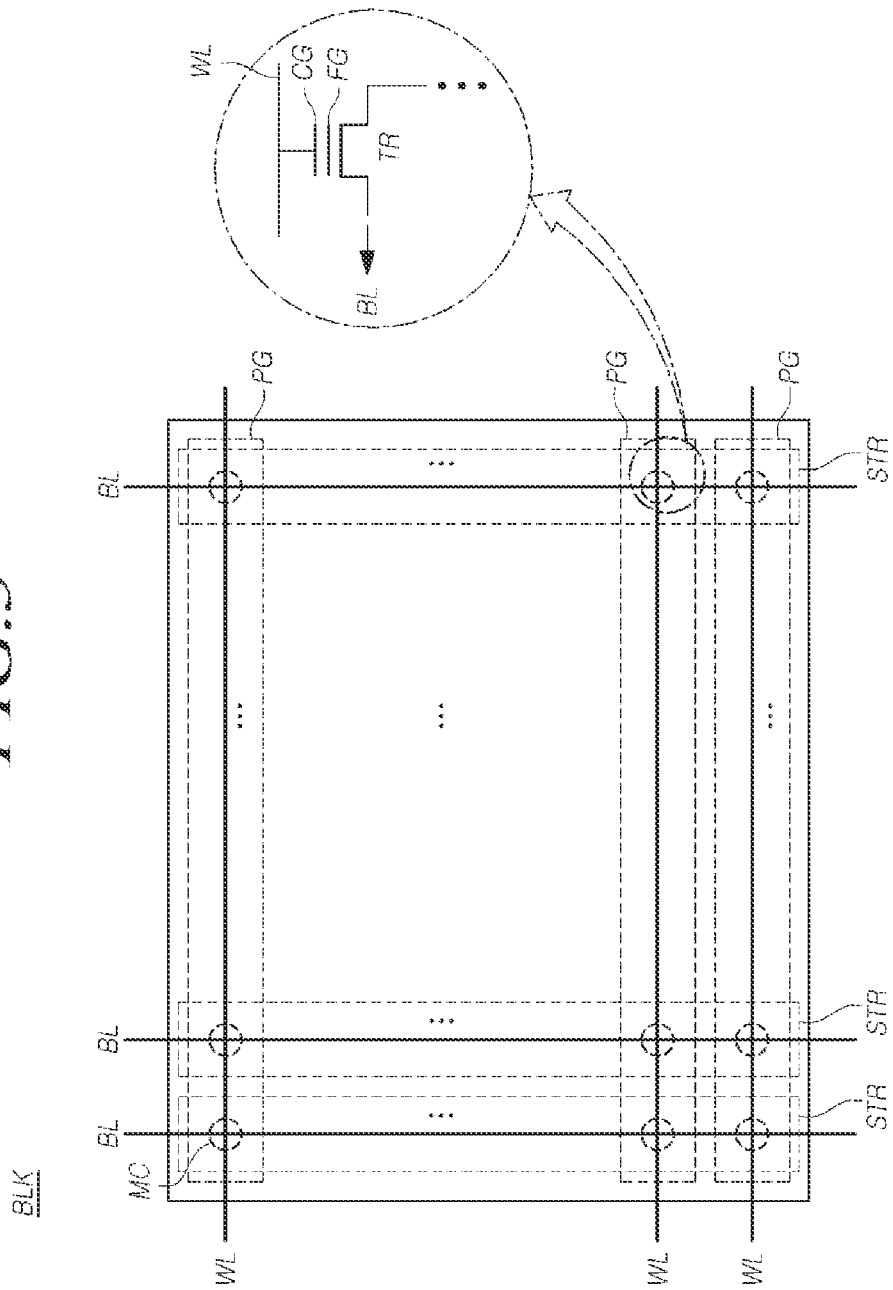
FIG. 3 is a diagram schematically illustrating respective memory blocks of a memory device according to an embodiment of the present disclosure.

FIG. 3 is a diagram schematically illustrating respective memory blocks BLK of a memory device 110 according to an embodiment of the present disclosure.

Referring to FIG. 3, a memory block BLK included in a memory device 110 may include, for example, multiple pages PG and multiple strings STR disposed in intersecting directions.

The multiple pages PG correspond to multiple word lines WL, and the multiple string STR correspond to multiple bit lines BL.

The memory block BLK may have multiple word lines WL and multiple bit lines BL disposed so as to intersect with each other. For example, each of the multiple word lines WL may be disposed in a row direction, and each of the multiple bit lines BL may be disposed in a column direction. As another example, each of the multiple word lines WL may be disposed in the column direction, and each of the multiple bit lines BL may be disposed in the row direction.

Multiple word lines WL and multiple bit lines BL may insect with each other, thereby defining multiple memory cells MC. Each memory cell MC may have a transistor TR disposed therein.

For example, the transistor TR disposed in each memory cell MC may include a drain, a source, a gate, and the like. The drain (or source) of the transistor TR may be directly connected to a corresponding bit line BL or connected thereto via another transistor TR. The source (or drain) of the transistor TR may be directly connected to a source line (which may be ground) or connected thereto via another transistor TR. The gate of the transistor TR may include a floating gate (FG) surrounded by an insulator and a control gate (CG) to which a gate voltage is applied from a word line WL.

Each of the multiple memory blocks BLK1-BLKz may have a first selection line (also referred to as a source selection line or a drain selection line) additionally disposed outside a first outermost word line, which is closer to the read-and-write circuit 230 among two outermost word lines BL, and may have a second selection line (also referred to as a drain selection line or a source selection line) additionally disposed outside a second outermost word line, which is the other among the same.

If necessary, at least one dummy word line may be additionally disposed between the first outermost word line and the first selection line. In addition, at least one dummy word line may be additionally disposed between the second outermost word line and the second selection line.

When having a memory block structure as illustrated in FIG. 3, a read operation and a program operation (write operation) may be performed page by page, and an erasure operation may be performed for each memory block.

Figure 4:
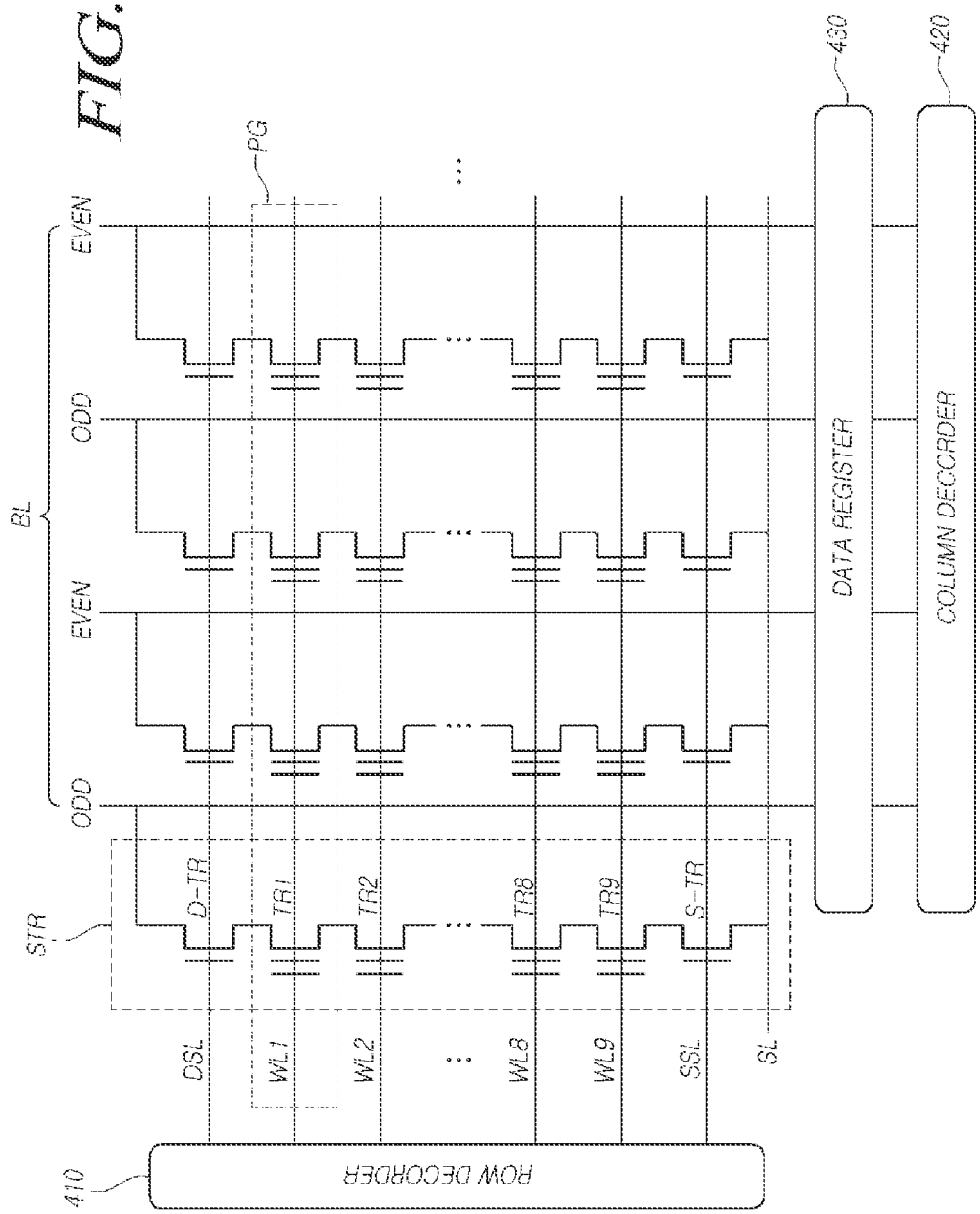
FIG. 4 is a diagram illustrating the structure of word lines and bit lines of a memory device according to an embodiment of the present disclosure.

FIG. 4 is a diagram illustrating the structure of word lines WL and bit lines BL of a memory device 110 according to an embodiment of the present disclosure.

Referring to FIG. 4, the memory device 110 includes a core area in which memory cells MC are concentrated and an auxiliary area which corresponds to the other area than the core area, and which supports operations of the memory cell array 210.

The core area may include pages PG and string STR. The core area has multiple word lines WL1-WL9 and multiple bit lines BL disposed to intersect with each other.

The multiple word lines WL1-WL9 may be connected to a row decoder 410, and the multiple bit lines BL may be connected to a column decoder 420. A data register 430, which corresponds to a read-and-write circuit 230, may exist between the multiple bit lines BL and the column decoder 420.

The multiple word lines WL1-WL9 correspond to multiple pages PG.

For example, as illustrated in FIG. 4, each of the multiple word lines WL1-WL9 may correspond to one page PG. Alternatively, when each of the multiple word lines WL1-WL9 has a large size, each of the multiple word lines WL1-WL9 may correspond to at least two (for example, two or four) pages PG. A page PG serves as the smallest unit in connection with conducting a program operation and a read operation, and all memory cells MC in the same page PG may perform simultaneous operations during a program operation and a read operation.

Among the multiple bit lines BL, odd-numbers hit lines BL and even-numbered bit lines BL may be distinguished and accordingly connected to the column decoder 420.

In order to access a memory cell MC, the address goes through the input/output end and then enters the core area through the row decoder 410 and the column decoder 420, and the target memory cell then can be designated. As used herein, designating a target memory cell refers to accessing one of memory cells MC at sites of intersection between word lines WL1-WL9 connected to the row decoder 410 and bit lines BL connected to the column decoder 420, in order to program data therein or to read programmed data therefrom.

Pages PG in a first direction (for example, X-axis direction) are grouped by a commonly used line referred to as a word line WL, and strings STR in a second direction (for example, Y-axis direction) are grouped (connected) by a common line referred to as a hit line BL, As used herein, being commonly grouped means that they are structurally connected by the same material, and the same voltage is simultaneously applied thereto during voltage application. Obviously, the voltage applied to a memory cell MC in the intermediate or last position among memory cells MC connected in series may slightly differ from the voltage applied to the memory cell MC in the first position and the voltage applied to the memory cell MC in the last position, due to the voltage drop occurring in the memory cell MC positioned in front thereof.

All data processed by the memory device 110 is programmed and read via the data register 430, which thus plays an essential role. If data processing by the data register 430 slows down, all other areas need to wait until the data register 430 finishes the data processing. In addition, performance degradation of the data register 430 may be followed by overall performance degradation of the memory device 110.

Referring to the example in FIG. 4, multiple transistors TR1-TR9 may exist in one string STR while being connected to multiple word lines WL1-WL9. The areas in which the multiple transistors TR1-TR9 exist correspond to memory cells MC. The multiple transistors TR1-TR9 are transistors including control gates CG and floating gates FG, as described above.

The multiple word lines WL1-WL9 include two outermost word lines WL1 and WL9. A first selection line DSL may be additionally disposed outside the first outermost word line WL1, which is closer to the data register 430 in terms of the signal path among the two outermost word lines WL1 and WL9, and a second selection line SSL may be additionally disposed outside the second outermost word line WL9 which is the other thereof.

The first selection transistor D-TR, which is controlled to turn on/off by the first selection line DSL, has a gate electrode connected to the first selection line DSL but includes no floating gate FG. The second selection transistor S-TR, which is controlled to turn on/off by the second selection line SSL, has a gate electrode connected to the second selection line SSL but includes no floating gate FG.

The first selection transistor D-TR plays the role of a switch that turns on or off the connection between the corresponding string STR and the data register 430. The second selection transistor S-TR plays the role of a switch that turns on or off the connection between the corresponding string STR and the source line SL. That is, the first selection transistor D-TR and the second selection transistor S-TR are positioned on both ends of the corresponding string STR and play the role of gatekeepers that connect and disconnect signals.

During a program operation, the memory system 100 needs to fill the target memory cell MC of the bit line BL, which is to be programmed, with electrons. Accordingly, the memory system 100 applies a turn-on voltage Vcc to the gate electrode of the first selection transistor D-TR, thereby turning on the first selection transistor D-TR, and applies a turn-off voltage (for example, 0V) to the gate electrode of the second selection transistor S-TR, thereby turning off the second selection transistor S-TR.

During a read operation or a verification operation, the memory system 100 turns on both the first selection transistor D-TR and the second selection transistor S-TR. Accordingly, a current may flow through the corresponding string STR and drain to a source line SL corresponding to the ground, thereby making it possible to measure the voltage level of the bit line BL. However, during a read operation, there may be a time difference in the on-off timing between the first selection transistor D-TR and the second selection transistor S-TR.

During an erasure operation, the memory system 100 may supply a voltage (for example, +20V) to the substrate through the source line SL. During the erasure operation, the memory system 100 floats both the first selection transistor D-TR and the second selection transistor S-TR, thereby generating an infinite resistance. The resulting structure removes the roles of the first selection transistor D-TR and the second selection transistor S-TR, and enables electrons to operate by means of the potential difference only between the floating gate FG and the substrate.

Figure 5:
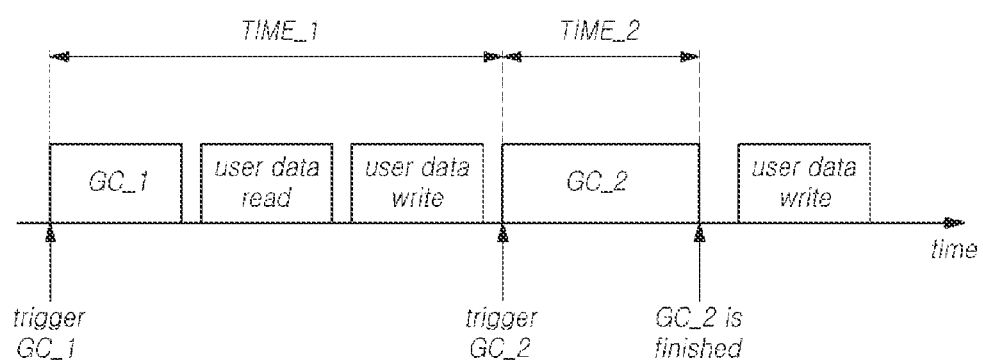
FIG. 5 is a timing diagram regarding operations of a memory system according to an embodiment of the present disclosure.

FIG. 5 is a timing diagram regarding operations of a memory system 100 according to an embodiment of the present disclosure.

The memory controller 120 included in the memory system 100 may perform garbage collection with regard to the memory device 100 on the basis of a first amount of time TIME_1 and a second amount of time TIME_2.

If it is determined that garbage collection needs to be performed, the memory controller 120 may start a preparatory operation (for example, stopping an ongoing read/write/erasure operation) needed to perform the garbage collection. When the preparatory operation starts, a garbage collection operation may be triggered.

The first amount of time TIME_1 refers to a period of time between triggering of first garbage collection GC_1 and triggering of second garbage collection GC_2. That is, TIME_1 corresponds to a period during which garbage collection is performed; TIME_1 may be repeated at a certain frequency.

During the first amount of time TIME_1, the memory controller 120 may perform triggered first garbage collection GC_1. In addition, during TIME_1, the memory controller 120 may read user data requested by the host from the memory device 110 or may write the same in the memory device 110.

The second amount of time TIME_2 refers to an amount of time taken to perform second garbage collection GC_2. Once the second garbage collection GC_2 is triggered, the memory controller 120 performs the second garbage collection GC_2 during TIME_2.

The memory controller 120 may perform second garbage collection GC_2 the moment the second garbage collection GC_2 is triggered. Alternatively, the memory controller 120 may perform second garbage collection GC_2 a specific amount of time after the second garbage collection GC_2 is triggered.

The longer TIME_1 becomes, the less frequently garbage collection is performed under the assumption of TIME_2 being fixed. This means that the ratio of garbage collection to all operations performed by the memory system 100 decreases. On the other hand, the longer TIME_2 becomes, the longer garbage collection is performed under the assumption of TIME_1 being fixed. This means that the ratio of garbage collection to all operations performed by the memory system 100 increases. Therefore, the memory system 100 may determine the ratio of garbage collection to all operations performed, on the basis of TIME_1 and TIME_2.

The memory system 100 may determine the above-mentioned TIME_1 and TIME_2 in various methods. Hereinafter, a criterion by which the memory system 100 determines TIME_1 and TIME_2 is described with reference to FIG. 6.

FIG. 6 is a diagram illustrating a criterion used by the memory system 100 according to an embodiment of the present disclosure to determine TIME_1 and TIME_2.

The memory controller 120 of the memory system 100 may determine TIME_1 and TIME_2 such that the ratio of TIME_1 to TIME_2 becomes a target ratio value (for example, 3:1 or 5:1), For example, the memory controller 120 may determine, in FIG. 6, the ratio of TIME_1 to TIME_2 to be 5:1.

The memory controller 120 may determine TIME_2 to be equal to or longer than a minimum garbage collection operation time.

For example, the minimum garbage collection operation time is 10 ms in FIG. 6.

In FIG. 6, pairs of TIME_1 and TIME_2, the ratio of which is 5:1, may include (25,5), (50, 10), (75, 15), (100, 20), and (125, 25).

The memory controller 120 may select, from the above-mentioned pairs, a pair satisfying the condition that the minimum garbage collection operation time is 10 ms or longer. In FIG. 6, the memory controller 120 may select (50, 10) and may control TIME_1 and TIME_2 to be 50 ms and 10 ms, respectively.

The reason the memory controller 120 of the memory it system 100 determines TIME_1 and TIME_2 such that the above-mentioned criterion is satisfied, in an embodiment of the present disclosure, is as follows:

As described with reference to FIG. 5, the longer the first amount of time TIME_1, the smaller the ratio of garbage collection performed among to all operations. The longer the second amount of time TIME_2, the greater the ratio of garbage collection performed among all operations.

Therefore, the memory controller 120 of the memory system 100 may determine a target ratio of TIME_1 to TIME_2 such that an appropriate ratio of garbage collection, relative to all operations, is performed. This may enable the memory controller 120 to perform efficient garbage collection.

A longer TIME_2 interrupts other operations (for example, reading/writing user data) for a longer amount of time. Therefore, while garbage collection is performed, a read operation or a write operation may be delayed. Consequently, if TIME_2 becomes too long, the memory system 100 may fail to satisfy the performance criterion required by the host.

On the other hand, a shorter TIME_2 may mean that a smaller number of free memory blocks are secured each time garbage collection is performed, and thus garbage collection is more frequently triggered. Frequent garbage collection requires overhead that can adversely affect the performance of the memory system 100.

Therefore, the memory controller 120 of the memory system 100 may select an appropriate value of TIME_2, which is equal to or longer than the minimum garbage collection operation time, so as to reduce overhead resulting from garbage collection and to satisfy the performance criterion (i.e., read/write latency) desired by the host. This may enable the memory controller 120 to perform efficient garbage collection.

The memory controller 120 may determine TIME_1 and TIME_2, which satisfy the above-mentioned criterion, in various methods. Hereinafter, a specific method for determining TIME_1 and TIME_2 by the memory controller 120 according to an embodiment is described with reference to the drawings.

A method for determining TIME_1 by the memory controller 120 is described first.

Figure 7:
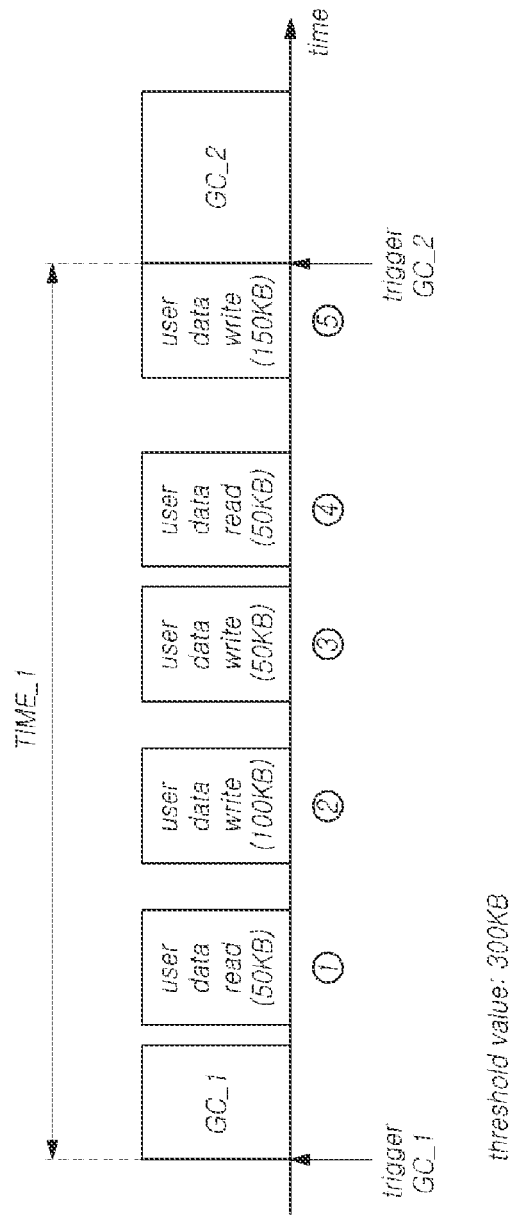
FIG. 7 is a diagram illustrating an example of determining the first amount of time in a memory system according to an embodiment of the present disclosure.

FIG. 7 is a diagram illustrating an example of determining TIME_1 in a memory system 100 according to an embodiment of the present disclosure.

For example, the memory controller 120 of the memory system 100 may determine TIME_1 on the basis of a time at which the total amount of the size of user data written in the memory device 110, since first garbage collection GC_1 is triggered, becomes equal to or greater than a threshold.

Referring to FIG. 7, after first garbage collection GC_1 is triggered, the host requests that 50 KB of user data be read from the to memory system 100 (①). Thereafter, the host requests that 100 KB of user data be written in the memory system 100 (②), and requests 50 KB of user data be written therein (③). Thereafter, the host requests that 50 KB of user data be read from the memory system 100 (④), and requests that 150 KB of user data be written in the memory system 100 (⑤).

The memory controller 120 may trigger second garbage collection GC_2 when the total amount of the size of user data written in the memory device 110, since first garbage collection GC_1 is trigger, becomes equal to or greater than a threshold. It is assumed in FIG. 7 that the threshold is 300 KB.

In FIG. 7, the host requests the memory system 100 to write 150 KB of user data, and the memory system 100 writes, in response thereto, 150 KB of user data in the memory device 110. The total amount of the size of user data written in the memory device 110, since first garbage collection GC_1 is triggered, becomes equal to or greater than a threshold of 100 KB+50 KB+150 KB=300 KB.

Then, the memory controller 120 of the memory system 100 may accordingly trigger second garbage collection GC_2. The first amount of time TIME_1 is determined as a period of time between triggering of first garbage collection GC_1 and triggering of second garbage collection GC_2.

The reason the memory controller 120 determines TIME_1 on the basis of the time at which the total amount of the size of user data written in the memory device 110 becomes equal to or greater than the threshold in FIG. 7 is because the user data writing operation has the largest influence on determining whether or not to perform garbage collection.

Specifically, if the size of invalid data increases while the size of valid data (i.e., user data) is increasing in the memory device 110 due to writing operations, the memory controller 120 may perform garbage collection.

On the other hand, other operations (for example, reading user data and erasing memory blocks) do not affect the total size of data in the memory device 110 since the size of valid data does not increase or can even decrease although the size of invalid data can increase. Therefore, other operations (for example, reading user data and erasing memory blocks) have no substantial influence on determining whether or not to perform garbage collection. In addition, if the memory controller 120 considers other operations to determine TIME_1, many factors need to be taken into account to determine TIME_1, thereby increasing the overhead for determining TIME_1.

Accordingly, in the above-described embodiment, the memory controller 120 may determine TIME_1 on the basis of the time at which the total amount of the size of user data written in the memory device 110, since first garbage collection GC_1 is triggered, becomes equal to or greater than a threshold.

An example of determining TIME_1 by the memory controller 120 has been described above.

Hereinafter, an example of determining the second amount of time TIME_2 to be equal to or longer than the minimum garbage collection operation time by the memory controller 120 is described.

Figure 8:
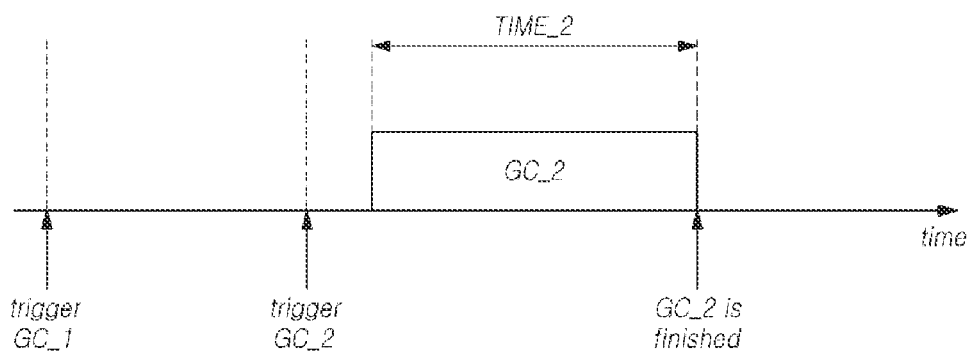
FIG. 8 is a diagram illustrating an example of determining the second amount of time in a memory system according to an embodiment of the present disclosure.

FIG. 8 is a diagram illustrating an example of determining TIME_2 in a memory system 100 according to an embodiment of the present disclosure.

The memory controller 120 of the memory system 100 may determine TIME_2 on the basis of a performance drop value X.

The performance drop value X may have a range of 0 to 100. The performance drop value X is the ratio (%) of garbage collection to all operations performed by the memory system 100. This means that the memory system 100 uses X % of all operations performed by the memory system 100 to perform garbage collection.

In an embodiment of the present disclosure, a method for determining the second amount of time TIME_2, during which second garbage GC_2 collection is performed, in order to determine the optimal time to perform garbage collection, on the basis of the performance drop value X, is described.

Hereinafter, a method for determining TIME_2 on the basis of the performance drop value X is described.

In embodiments of the present disclosure, the entire performance or resources of the memory system 100 may be defined as the sum of the performance or resources for garbage collection (GC_PERFORM) and the performance or resources used to process user data (USER_PERFORM). USER_PERFORM includes, for example, read and write processing.

A performance drop value of X may be defined by Equation 1 below:

$$X:(100-X)=GC\_PERFORM: USER\_PERFORM \quad [\text{Equation 1}]$$

What is frequently performed when garbage collection is performed is an operation of writing data in the memory device 110, that is, operation of writing valid data stored in a memory block of the memory device 110 in another memory block of the memory device 110. Therefore, the performance used for garbage collection (GC_PERFORM) is proportional to a first data size DATA_SIZE_1, which the size of data written in the memory device 110 when second garbage collection GC_2 is performed.

In addition, an operation of writing user data during an operation of processing user data has a large influence on performing garbage collection, as described with reference to FIG. 7. Accordingly, the USER_PERFORM is proportional to a second data size DATA_SIZE_2, which is the size of user data written in the memory device 110 after first garbage collection GC_1 within the first amount of time TIME_1.

Therefore, the above-mentioned Equation 1 may also be expressed by Equation 2 below:

$$X:(100-X)=DATA\_SIZE\_1: DATA\_SIZE\_2 \quad [\text{Equation 2}]$$

In Equation 2 above, the first data size DATA_SIZE_1 may be determined by determining the performance drop value X and the second data size DATA_SIZE 2.

Figure 9:
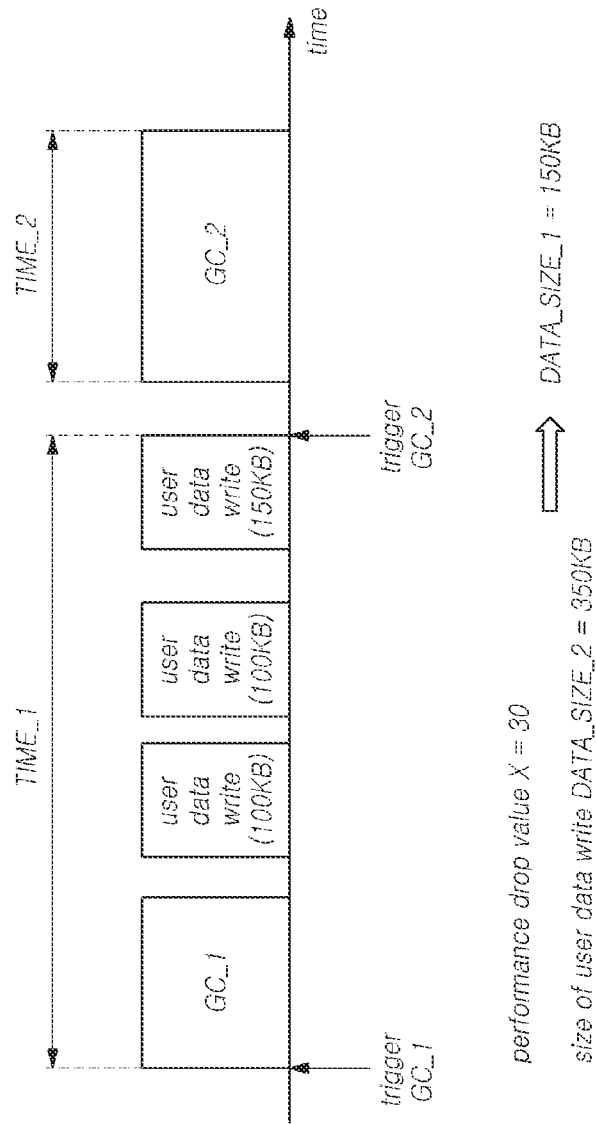
FIG. 9 is a diagram illustrating an example of determining a first data size in order to determine the second amount of time in a memory system according to an embodiment of the present disclosure.

FIG. 9 is a diagram illustrating an example of determining DATA_SIZE_1 in order to determine the TIME_2 in a memory system 100 according to an embodiment of the present disclosure.

It will be assumed in FIG. 9 that the performance drop value X is 30, and the second data size DATA_SIZE_2 is 100 KB+100 KB+150 KB=350 KB.

The first data size DATA_SIZE_1 may then be determined as follows:

30:70=DATA_SIZE_1: 350 KB

DATA_SIZE_1=((350 KB*30)/70)=150 KB

After the first data size DATA_SIZE_1 is determined in this manner, TIME_2 may be determined as follows:

For example, TIME_2 may be determined on the basis of a value obtained by dividing the first data size DATA_SIZE_1 by the number of partial programs (NOP) representing a number of unit pieces of data that can be programmed in the memory device 110 per a set amount of time (for example, 100 ms). A unit piece of data may have a size equal to or smaller than the page size (for example, 4 KB or 8 KB).

It will be assumed for example that the unit piece of data is 1 KB, and NOP is 100. This means that 100 KB of data can be written in the memory device 110 per 100 ms. Accordingly, if the first data size DATA_SIZE_1 is 150 KB, the second amount of time TIME_2 may be determined as (150 KB/(100*(1 KB)))*100=150 (ms).

It has been described in the above embodiment that the user data writing operation, among user data processing operations, has a large influence on garbage collection. Accordingly, the performance used to process user data (USER_PERFORM) has been defined as the performance used to write user data having the second data size DATA_SIZE_2 described above.

However, if the memory system 100 performs the operation of reading user data from the memory device 110 more frequently than the operation of writing user data in the memory device 110, most resources used to process user data may be assigned to the operation of reading user data from the memory device 110. In this case, the performance used to process user data (USER_PERFORM) is preferably defined as the performance used to read user data, instead of the performance used to write user data having the second data size DATA_SIZE_2.

Therefore, the performance used to process user data (USER_PERFORM) may also be defined as a read time READ_TIME, which is the time spent to perform an operation of reading user data after first garbage collection GC_1 within the first amount of time TIME_1.

In this case, with regard to a performance drop value X, the second amount of time TIME_2 may be determined by Equation 3 below:

$$X:(100-X)=READ\_TIME \quad [\text{Equation 3}]$$

Figure 10:
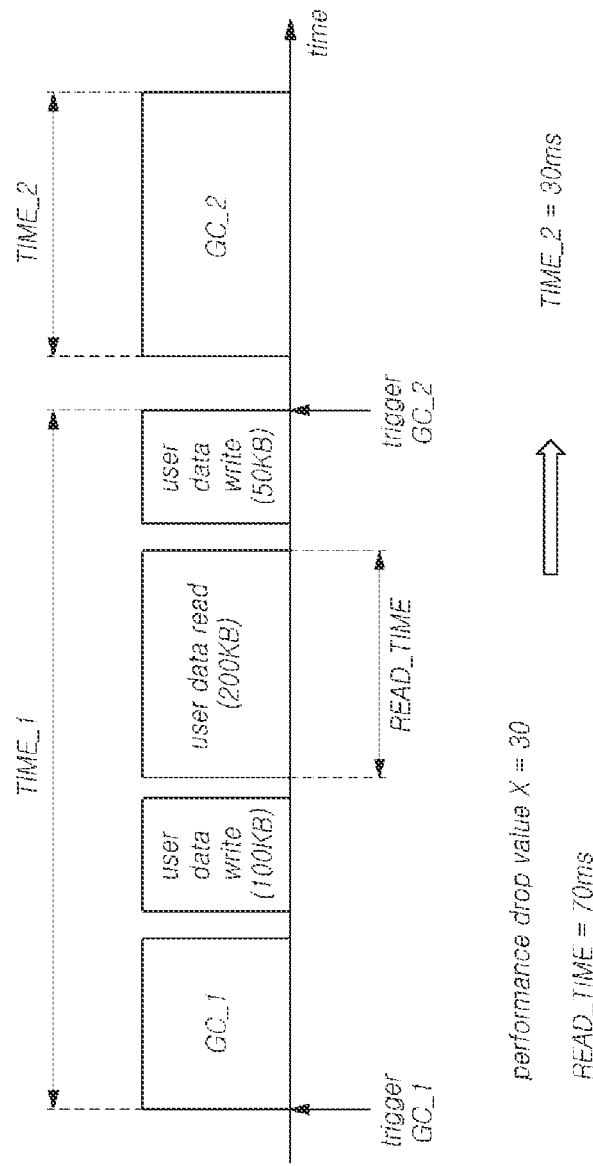
FIG. 10 is a diagram illustrating another example of determining the second amount of time in a memory system according to an embodiment of the present disclosure.

FIG. 10 is a diagram illustrating another example of determining TIME_2 in a memory system 100 according to an embodiment of the present disclosure.

It will be assumed in FIG. 10 that the performance drop value X is 30, and that the time spent to perform the operation of reading 200 KB of user data is 70 ms within the first amount of time TIME_1.

In this case, the second amount of time TIME_2 may be determined by Equation 3 given above in the following manner:

30:(100-30)=TIME_2: 70 ms

TIME_2=30 ms

To summarize the description of FIGS. 5 to 10, the memory system 100 may determine TIME_1 and TIME_2 so as to satisfy a criterion (for example, performance drop value, the ratio between TIME_1 and TIME_2, or minimum garbage collection operation time), and may perform garbage collection on the basis thereof.

This makes it unnecessary to tune parameters necessary for the garbage collection operation for each device having the memory system 100 implemented therein. Accordingly, the overhead occurring in the process of tuning parameters necessary for the garbage collection operation is reduced.

In addition, even if the criterion is changed by varying external environments (for example, power supply and temperature), the memory system 100 can change TIME_1 and TIME_2 such that the garbage collection operation can be optimized according to the changed criterion. This enables the memory system 100 to flexibly handle the varying external environments.

Figure 11:
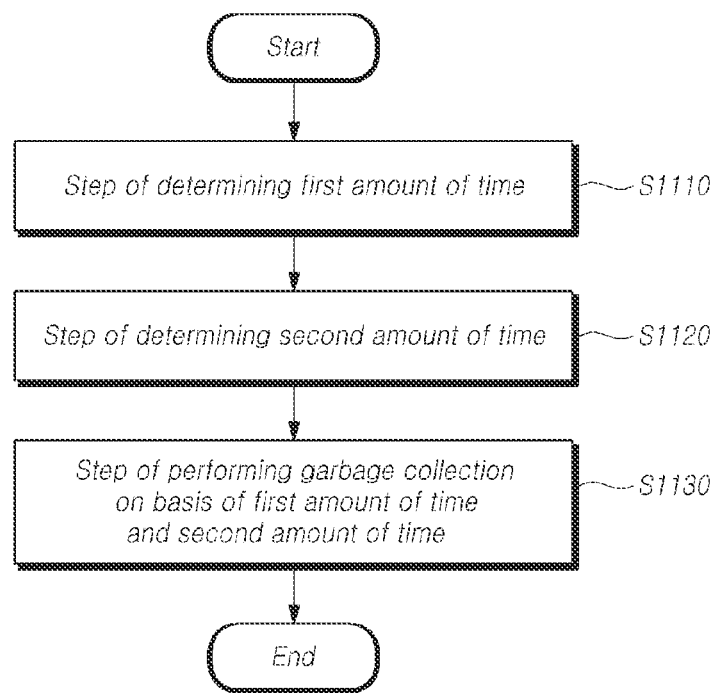
FIG. 11 is a diagram illustrating a method for operating a memory controller according to an embodiment of the present disclosure.

FIG. 11 is a diagram illustrating a method for operating the memory controller 120 according to an embodiment of the present disclosure.

The method for operating the memory controller 120 may include a step of determining a first amount of time TIME_1, which is the period of time between triggering of first garbage collection GC_1 and triggering of second garbage collection GC_2 (S1110).

In addition, the method for operating the memory controller 120 may include a step of determining a second amount of time TIME_2, which is the time necessary to perform the second garbage collection GC_2 (S1120).

In addition, the method for operating the memory controller 120 may include a step of performing garbage collection with regard to the memory device 110 on the basis of TIME_1 and TIME_2 (S1130).

The ratio TIME_1 to TIME_1 may be determined as a target ratio value, and TIME_2 may be determined to be equal to or longer than a minimum garbage collection operation time.

Figure 12:
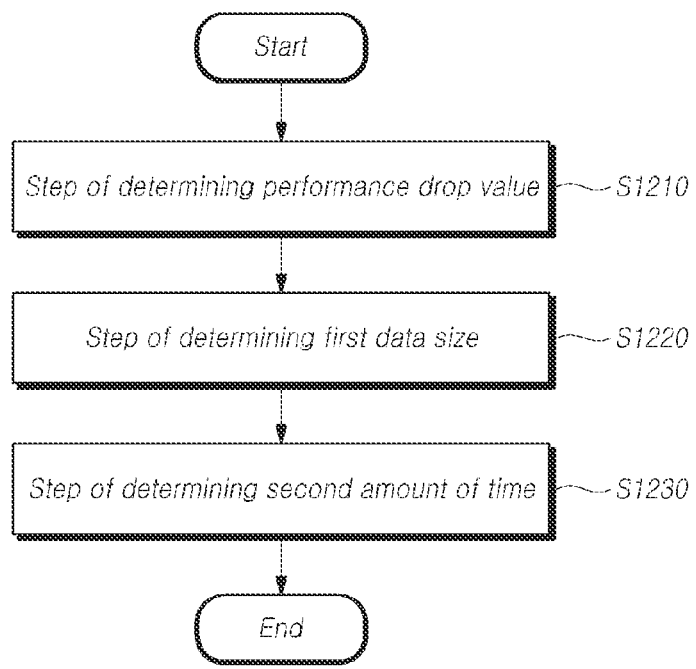
FIG. 12 is a flowchart illustrating a method for determining the second amount of time in a memory system according to an embodiment of the present disclosure.

FIG. 12 is a flowchart illustrating a method for determining it the second amount of time TIME_2 in the memory system 100 according to an embodiment of the present disclosure.

The method for determining the second amount of time TIME_2 may include a step of determining a performance drop value X (S1210).

In addition, the method for determining TIME_2 may include a step of determining a first data size DATA_SIZE_1, which is the size of data written in the memory device 110 when performing second garbage collection GC_2, on the basis of the performance drop value X determined in step S1210 (S1220).

The first data size DATA_SIZE_1 may be determined on the basis of the performance drop value X and a second data size DATA_SIZE_2, which is the size of user data written in the memory device 110 after garbage collection is triggered.

TIME_2 may then be determined on the basis of the above-mentioned performance drop value, the first data size DATA_SIZE_1, and the second data size DATA_SIZE_2 (S1230).

The above-described operations of the memory controller 120 may be controlled by the control circuit 123, and may be performed in such a manner that the processor 124 executes (drives) firmware to perform such operations.

Figure 13:
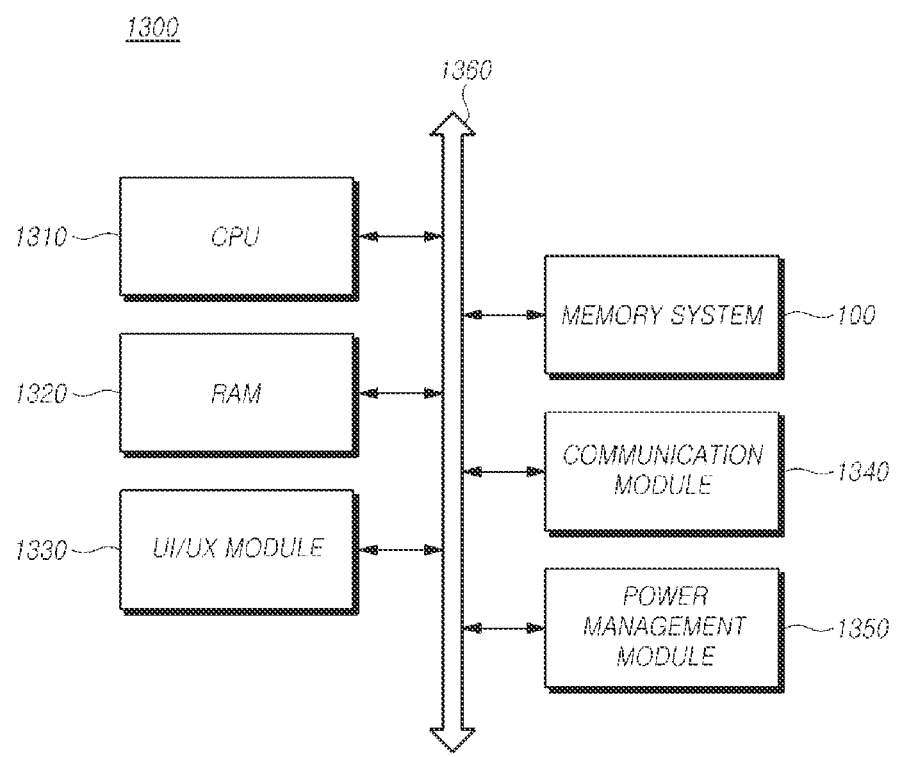
FIG. 13 is a diagram illustrating a configuration of a computing system according to an embodiment of the present disclosure.

FIG. 13 is a diagram illustrating a configuration of a computing system 1300 according to an embodiment of the present disclosure.

Referring to FIG. 13, the computing system 1300 may include: a memory system 100 electrically connected to a system bus 1360; a CPU 1310 configured to control overall operation of the computing system 1300; a RAM 1320 configured to store data and information related to operations of the computing system 1300; a user interface/user experience (UI/UX) module 1330 configured to provide the user with a user environment; a communication module 1340 configured to communicate with an external device in a wired/and/or wireless manner; a power management module 1350 configured to manage power used by the computing system 1300; and the like.

The computing system 1300 may be a personal computer (PC) or may include a mobile terminal (for example, a smartphone or a tablet) or various kinds of other electronic devices.

The computing system 1300 may further include a battery for supplying a dynamic voltage, an application chipset, a graphic-related module, a camera image processor (CIS), and a DRAM. It is obvious to a person skilled in the art that the computing system 1300 may further include other components.

The memory system 100 may include not only a device configured to store data in a magnetic disk, such as a hard disk drive (HDD), but also a device configured to store data in a nonvolatile memory, such as a solid state drive (SSD), a universal flash storage (UFS) device, and an embedded MMC (eMMC) device. The nonvolatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM). Furthermore, the memory system 100 may be implemented as any of various storage devices mounted inside any of various electronic devices.

Although the present invention has been illustrated and described in connection with various embodiments, those skilled in the art will appreciate that various modifications and changes may be made without departing from the scope and spirit of the present invention. Thus, the present invention is not limited by or to any of the disclosed embodiments, Rather, the present invention encompasses all modifications and variations that fall with the scope of the claims including their equivalents.

What is claimed is:

1. A memory system comprising:
a memory device; and
a memory controller configured to control the memory device, wherein the memory controller is further configured to:
determine a ratio of a first amount of time to a second amount of time to be a target ratio value of garbage collection, wherein the first amount of time is a period of time between a triggering of first garbage collection and a triggering of second garbage collection, and the second amount of time is longer than a controller-selected minimum garbage collection operation time and begins at the triggering of the second garbage collection and ends when the second garbage collection ends; and
perform the first garbage collection and the second garbage collection by setting the first amount of time and the second amount of time based on the target ratio value and setting a first time point when the first garbage collection is triggered and setting a second time point when the second garbage collection is triggered based on the first time point and the first amount of time between the triggering of the first garbage collection and the triggering of the second garbage collection,
wherein the memory controller is configured to select a pair of the first amount of time and the second amount of time such that the ratio of the first amount of time to the second amount of time is the target ratio value and the second amount of time is longer than the controller-selected minimum garbage collection operation time, wherein the memory controller is configured to perform, during the first amount of time, the first garbage collection, and read user data requested by a host or write user data requested by the host, and wherein the memory controller is configured to perform, without reading or writing the user data requested by the host, the second garbage collection during the second amount of time.

2. The memory system of claim 1, wherein the memory controller is further configured to trigger the second garbage collection when the total sum of the size of user data written in the memory device, since the triggering of the first garbage collection, becomes equal to or greater than a threshold.

3. The memory system of claim 1, wherein the memory controller is configured to determine the second amount of time on the basis of a performance drop value, wherein the performance drop value is the ratio of garbage collection to all operations performed by the memory system.

4. The memory system of claim 3, wherein the memory controller is further configured to determine a first data size, which is the size of data written in the memory device during the second garbage collection, on the basis of i) the performance drop value and ii) a second data size, which is the total sum of the size of user data written in the memory device since the first garbage collection is triggered.

5. The memory system of claim 4, wherein the memory controller is configured to determine the second amount of time, wherein the second amount of time is the value obtained by dividing the first data size by a multiplication of a size of unit piece of data and a number of partial programs that can be programmed in the memory device per a set amount of time.

6. The memory system of claim 3, wherein the memory controller is configured to determine the second amount of time on the basis of i) a performance drop value and ii) a read time, which is an amount of time spent to perform a user data reading operation since the first garbage collection is triggered.

7. A memory controller comprising:

a memory interface configured to communicate with a memory device; and a control circuit configured to control the memory device, wherein the control circuit is further configured to:

determine a ratio of a first amount of time to a second amount of time to be a target ratio value or garbage collection, wherein the first amount of time is a period of time between a triggering of first garbage collection and a triggering of second garbage collection, and the second amount of time is longer than a controller-selected minimum garbage collection operation time and begins at the triggering of the second garbage collection and ends when the second garbage collection ends; and perform the first garbage collection and the second garbage collection by setting the first amount of time and the second amount of time based on the target ratio value and setting a first time point when the first garbage collection is triggered and setting a second time point when the second garbage collection is triggered based on the first time point and the first amount of time between the triggering of the first garbage collection and the triggering of the second garbage collection, wherein the control circuit is configured to select a pair of the first amount of time and the second amount of time such that the ratio of the first amount of time to the second amount of time is the target ratio value and the second amount of time is longer than the controller-selected minimum garbage collection operation time, wherein the control circuit is configured to perform, during the first amount of time, the first garbage collection, and read user data requested by a host or write user data requested by the host, and wherein the control circuit is configured to perform, without reading or writing the user data requested by the host, the second garbage collection during the second amount of time.

8. The memory controller of claim 7, wherein the control circuit is further configured to trigger the second garbage collection when the total sum of the size of user data written in the memory device, since triggering of the first garbage collection, becomes equal to or greater than a threshold.

9. The memory controller of claim 7, wherein the control circuit is configured to determine the second amount of time on the basis of a performance drop value, wherein the performance drop value is the ratio of garbage collection to all operations performed by a memory system including the memory controller.

10. The memory controller of claim 9, wherein the control circuit is further configured to determine a first data size, which is a size of data written in the memory device during the second garbage collection, on the basis of i) the performance drop value and ii) a second data size, which is the total sum of the size of user data written in the memory device since the first garbage collection is triggered.

11. The memory controller of claim 10, wherein the control circuit is configured to determine the second amount of time, wherein the second amount of time is the value obtained by dividing the first data size by a multiplication of a size of unit piece of data and a number of partial programs that can be programmed in the memory device per a set amount of time.

12. The memory controller of claim 9, wherein the control circuit is configured to determine the second amount of time on the basis of i) a performance drop value and ii) a read time, which is an amount of time spent to perform a user data reading operation since the first garbage collection is triggered.

13. A method for operating a memory controller configured to control a memory device, the method comprising:

determining a first amount of time based on first garbage collection, which is a period of time between a triggering time point of the first garbage collection and a triggering time point of the second garbage collection;

determining a second amount of time based on the second garbage collection which is longer than a controller-selected minimum garbage collection operation time and which begins at the triggering time point of the second garbage collection and ends when the second garbage collection ends; and performing the first garbage collection and the second garbage collection with regard to the memory device on the basis of the first amount of time and the second amount of time, and setting a first time point when the first garbage collection is triggered and setting a second time point when the second garbage collection is triggered based on the first time point and the first amount of time between the triggering time point of the first garbage collection and the triggering time point of the second garbage collection, wherein a pair of the first amount of time and the second amount time is selected such that a ratio of the first amount of time to the second amount of time is determined to be a target ratio value, and the second amount of time is determined to be longer than the controller-selected minimum garbage collection operation time, wherein the memory controller is configured to perform, during the first amount of time, the first garbage collection, and read user data requested by a host or write user data requested by the host, and wherein the memory controller is configured to perform, without reading or writing the user data requested by the host, the second garbage collection during the second amount of time.

14. The method of claim 13, wherein the first amount of time is determined on the basis of a time at which the total sum of the size of user data written in the memory device, since triggering of the first garbage collection, becomes equal to or greater than a threshold.

15. The method of claim 13, wherein the second amount of time is determined on the basis of a performance drop value.

16. The method of claim 15, wherein the determining of a second amount of time includes determining a first data size, which is a size of data written in the memory device during the second garbage collection, on the basis of i) the performance drop value and ii) a second data size, which is the total sum of the size of user data written in the memory device after the first garbage collection is triggered.

* * * * *